US009407249B2

(12) United States Patent  (10) Patent No.: US 9,407,249 B2
Seth et al.  (45) Date of Patent: Aug. 2, 2016

(54) SYSTEM AND METHOD FOR PULSE WIDTH MODULATION

(71) Applicant: Texas Instruments, Dallas, TX (US)

(72) Inventors: Sumantra Seth, Bangalore (IN); Uttam Kumar Patro, Bangalore (IN); Jagdish Chand Goyal, Bangalore (IN); Biman Chattopadhyay, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 41 days.

(21) Appl. No.: 14/298,428

(22) Filed: Jun. 6, 2014

(65) Prior Publication Data
US 2014/0361829 A1  Dec. 11, 2014

(30) Foreign Application Priority Data
Jun. 6, 2013  (IN) .......................... 2488/CHE/2013

(51) Int. Cl.
*H03K 9/08*  (2006.01)
(52) U.S. Cl.
CPC ....................................... *H03K 9/08* (2013.01)
(58) Field of Classification Search
CPC ....................................................... H03K 9/08
USPC .......................................... 329/312; 375/238
See application file for complete search history.

(56) References Cited

U.S. PATENT DOCUMENTS

| 5,451,893 | A | * | 9/1995 | Anderson | H03K 9/08 327/174 |
| 2007/0076792 | A1 | * | 4/2007 | Ivanov | H03K 9/08 375/238 |
| 2009/0001946 | A1 | * | 1/2009 | Mehas | H02M 1/36 323/266 |
| 2014/0292402 | A1 | * | 10/2014 | Nandy | H03K 9/08 329/312 |

* cited by examiner

*Primary Examiner* — Jeffrey Shin
(74) *Attorney, Agent, or Firm* — Ronald O. Neerings; Frank D. Cimino

(57) ABSTRACT

A circuit for use with PWM signal having first pulse and a second pulse, wherein the first pulse has a period and a first duty cycle, and the second pulse has the period and a second duty cycle. The period has clock information therein, the first duty cycle has first data information therein, and the second duty cycle has second data information therein. The circuit includes a first integrating component and a second integrating component. The first integrating component can generate a first voltage corresponding to the first duty cycle and a second voltage corresponding to the first duty cycle. The second integrating component can generate a third voltage corresponding to the second duty cycle and a fourth voltage corresponding to the second duty cycle.

18 Claims, 9 Drawing Sheets

$T_H > T_L \rightarrow$ DATA OUTPUT IS 1
$T_H < T_L \rightarrow$ DATA OUTPUT IS 0

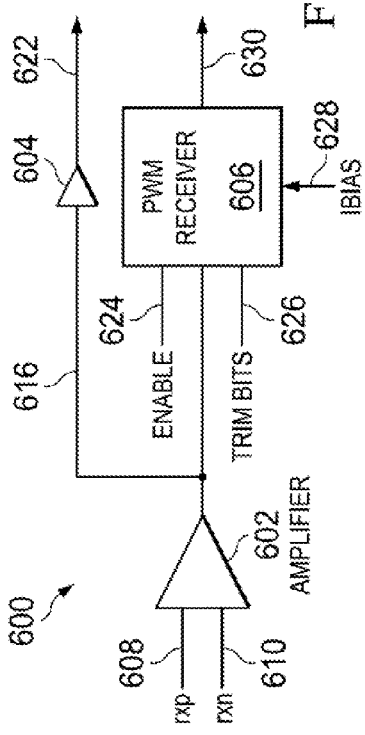
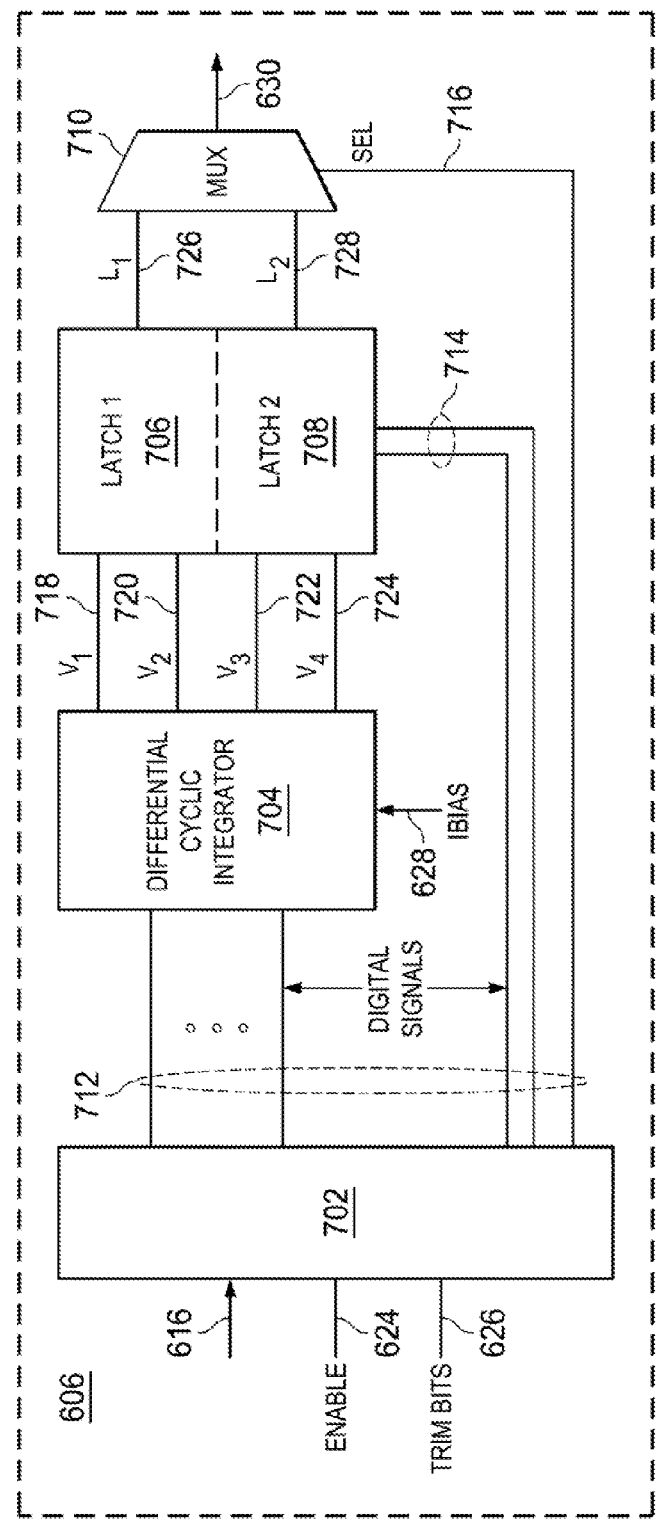

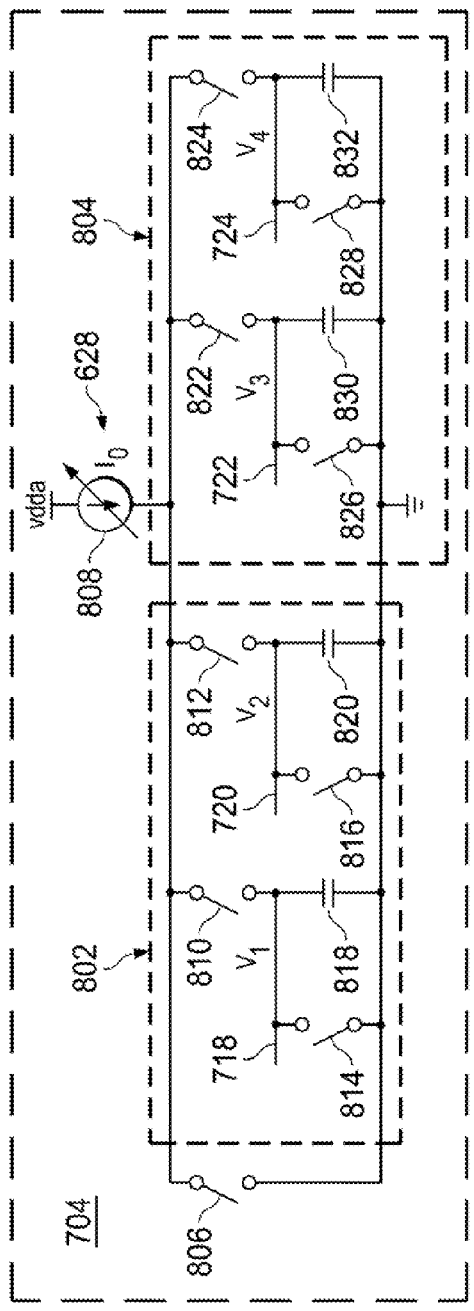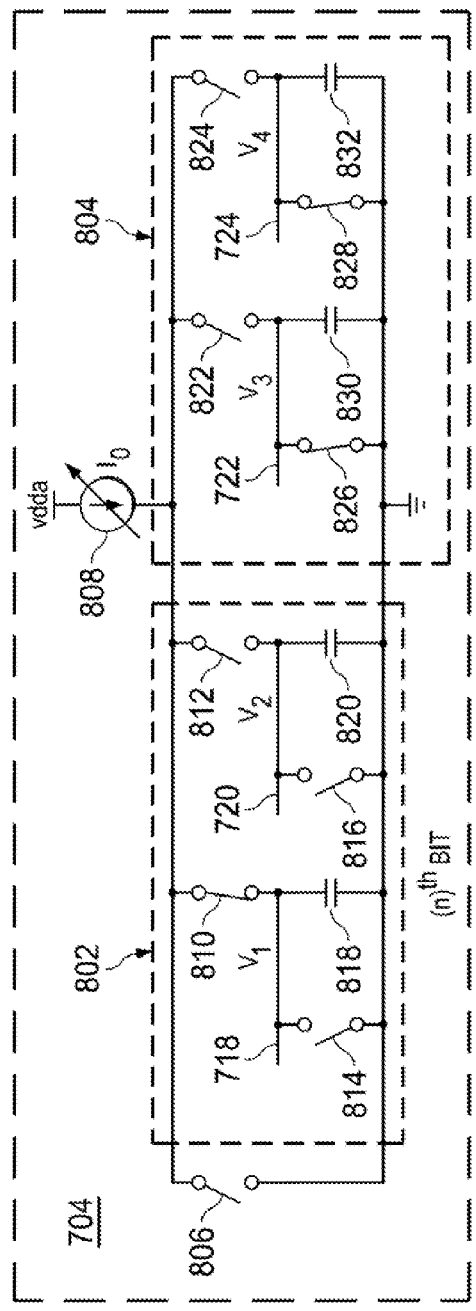

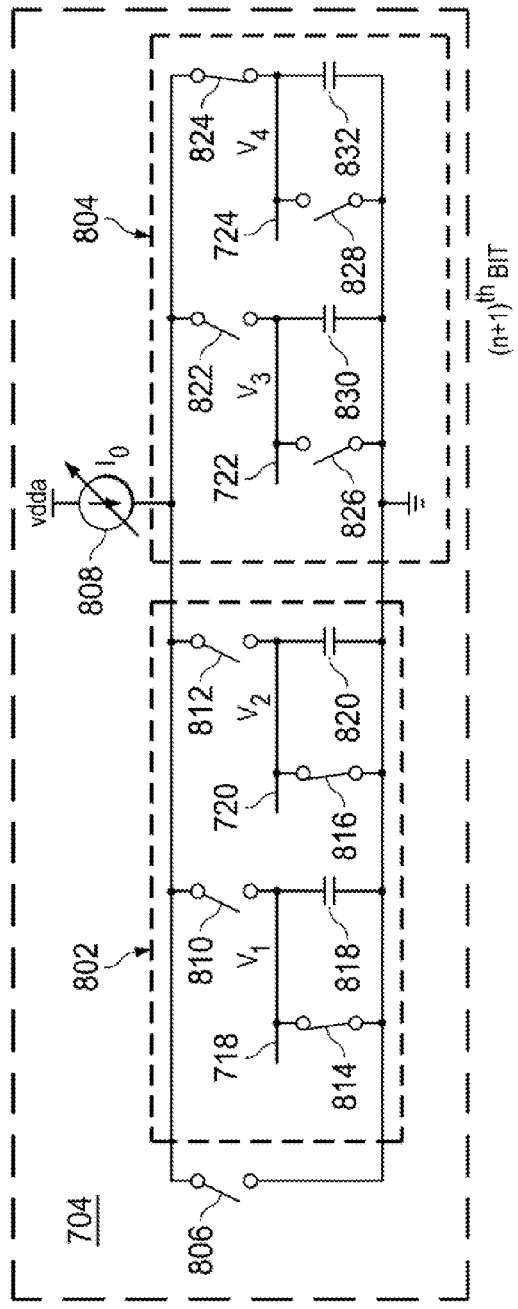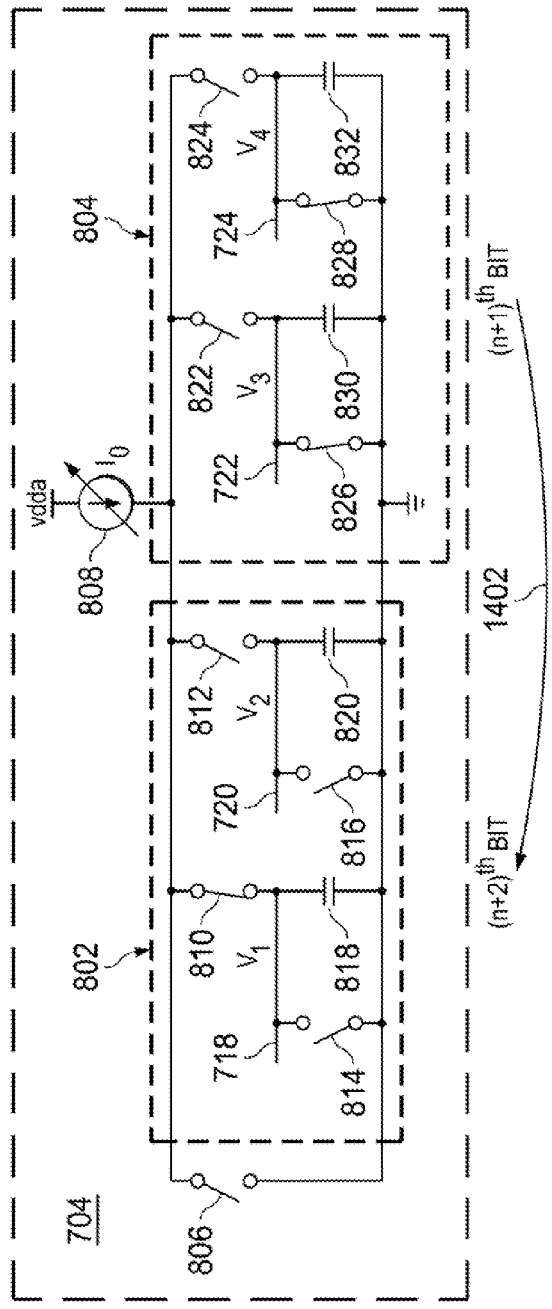
FIG. 13
FIG. 14

SYSTEM AND METHOD FOR PULSE WIDTH MODULATION

BACKGROUND

The present invention is generally drawn to a pulse width modulation receiver.

Interfaces used for inter/intra-device communication in a chip run in two modes: 1) high-performance and hence high-power mode: and 2) low-performance and hence low-power mode. One of the low-power modes is a pulse width modulation (PWM) mode, where the data information is hidden in the duty-cycle and the clock information is hidden in the period. In the PWM mode, there is no separate external clock available to save power.

FIG. 1 illustrates an electronic device 100 that uses PWM signals for internal communication.

As shown in the figure, electronic device 100 includes a component 102, a component 104 and a component 106. Component 102 is operable to transmit a PWM signal 112 to component 104 via a communication channel 108. Component 104 and component 106 are operable to send signals 114 to one another is a communication channel 110. As used herein, a communication channel is any channel that is able to transmit a PWM signal, non-limiting examples of which include a wired channel and wireless channel.

M-PHY is a mobile-telephone technology standard that uses PWM inter/intra-device communication. Some of the M-PHY constraints include: no external clock being available; valid data should be at the end of the bit (i.e., the output of the $n^{th}$ bit should be available in the $(n+1)^{th}$ bit); and the input of the PWM signal is a low voltage differential signal. A low-power PWM signal for inter/intra-device communication in a chip will now be further described with reference to FIG. 2.

FIG. 2 illustrates differential PWM signal 112 and its corresponding data output 200 and clock output 202.

As shown in the figure, PWM signal 112 includes a positive differential signal 204, a negative differential signal 206 and a common mode signal 208. PWM signal 112 further includes an $n^{th}$ bit 210 and a $(n+1)^{th}$ bit 212. Bit 210 has a $T_L$ portion 214 and a $T_H$ portion 216. Bit 212 has a $T_L$ portion 218 and a $T_H$ portion 220.

PWM signal 112 has a period that is the length of one bit. However, the duty cycle of each bit may vary in accordance with the data therein. In particular, the duty cycle of bit 210 is the ratio of $T_H$ portion 216 to $T_L$ portion 214, whereas the duty cycle of bit 212 is the ratio of $T_H$ portion 220 to $T_L$ portion 218.

When demodulated by a PWM receiver (not shown), PWM signal 112 may be broken into data output 200 and clock output 202. Further, data output 200 includes an output bit 222 and an output bit 224 and clock output 202 includes a plurality of pulses.

The value of a bit in data output 200 is based on the duty cycle of the corresponding bit in PWM signal 112. If the $T_H$ portion of a bit is larger than the $T_L$ portion of that bit, then the corresponding bit in the data output is a 1. In this example, $T_H$ portion 216>$T_L$ portion 214. Therefore the value of corresponding output bit 222 is 1. Alternately, if the $T_L$ portion of a bit is larger than the $T_H$ portion of that bit, then the corresponding bit in the data output is a 0. In this example, $T_L$ portion 218>$T_H$ portion 220. Therefore the value of corresponding output bit 224 is 0.

One main problem associated with receiving and demodulating a low-power PWM mode signal is that no reference clock is available. One conventional method to address this issue is by using a PWM receiver that includes a phase lock loop. This will be described with reference to FIG. 3.

FIG. 3 illustrates a conventional PWM receiver 300.

As shown in the figure, conventional PWM receiver 300 includes a phase lock loop (PLL) 302 and a demodulator 304.

PLL 302 is arranged to receive a PWM signal 306 and output a plurality of signals 308. Demodulator 304 is arranged to receive the plurality of signals 308 and to output a plurality of bits and a clock signal, all of which are indicated by 310.

The implementation using PLL 302 consists of over-sampling the high time ($T_H$) and low time ($T_L$) using the PLL clock of a frequency, $F_{clk}$, as follows:

$$F_{clk} > (F_{input}/\text{minimum duty-cycle}). \quad (1)$$

An example of $T_H$ and $T_L$ will be described with reference to FIG. 4.

FIG. 4 illustrates an example PWM signal 306.

As shown in the figure, PWM signal 306 includes a bit 402 and a bit 404. PWM signal 306 is illustrated as a non-differential signal to simplify the discussion. It should be noted that some conventional PWM receivers similar to conventional. PWM receiver 300 use differential signals and others use non-differential signals. Bit 402 has a $T_L$ portion 406 and a $T_H$ portion 408. Bit 404 has a $T_L$ portion 410 and a $T_H$ portion 412.

Returning to FIG. 3, in operation, PLL 302 may sample PWM signal 306 at a much higher frequency than the frequency of PWM signal 306. For purposes of discussion, presume that while sampling PWM signal 306, PLL 302 will obtain 100 consecutive low values associated with $T_L$ 406 and will obtain 300 consecutive high values associated with $T_H$ 408. These sampled values may be passed to demodulator 304 via plurality of signals 308. Demodulator 304 may then determine, among other things outside the scope of this discussion, the duty cycle of PWM signal 306 based on the ratio of sampled low values and sampled high values.

Setting the frequency of the clock of PLL 302 in accordance with equation (1) will yield at least one sample of signal 306 per high/low time. This is a theoretical/ideal implementation. However, to be practically feasible, $F_{clk}$ should be as follows:

$$F_{clk} > 3(F_{input}/\text{minimum duty-cycle}), \quad (2)$$

Setting the frequency of the clock of PLL 302 in accordance with equation (2) will account for false sampling at the two edges of high/low duration. In any event, the samples are stored in a counter and a digital comparator to give out data based on the high/low samples. This data is shown at plurality of signals 308. As the input frequency increases, PLL 302 needs to use a higher frequency clock, which means higher current consumption. For example, PLL 302 may operate at ~2 mA for 2 GHz, an implementation of which contradicts the very meaning of transmitting/receiving in PWM mode. Therefore digital implementation becomes power hungry at higher frequencies.

Another problem is that the input frequency can vary up to a factor of three within an operation mode, and there are different operating frequencies based on different modes of operation, referred to as gears in the M-PHY specification. For example: in the first gear, the frequency range of support is from 3 MHz-9 MHz; in the first gear, the frequency range of support is from 6 MHz-18 MHz; in the third gear, the frequency range of support is from 12 MHz-36 MHz; in the fourth gear, the frequency range of support is from 24 MHz-72 MHz; and in the fifth gear, the frequency range of support is from 48 MHz-144 MHz.

Conventional systems for addressing the problem above include designing a circuit for operation at the highest frequency and expecting the circuit to work for lowest frequency without consuming extra power. Once such system includes a delay cell based implementation, for lower frequency within a gear the number of delay cells traversed. This will be described in greater detail with reference to FIG. 5

FIG. 5 illustrates another conventional PWM receiver 500.

As shown in the figure, conventional PWM receiver 500 includes a plurality of delay cells 502 and a latch comparator 504. The plurality of delay cells 502 are arranged to receive a PWM signal 506. PWM signal 506 then circulates through the plurality of delay cells 502 in a direction indicated by arrow 508 and are output to latch comparator 504. Latch comparator 504 is arranged to output a data signal 510.

In operation, whenever the value of PWM signal 506 is low, it is passed in the direction of arrow 508. For example, suppose PWM 506 starts with a negative edge. Whenever there is a negative edge, PWM 506 passes in the forward direction, from the first delay element to the second delay element, etc. As soon as there is a rising edge at the input, PWM 506 moves in the opposite direction and latch comparator 504 latches PWM 506 directly.

For purposes of discussion, consider the situation where PWM 506 as an input duty cycle of 40-60, i.e., 40% low and 60% high. For 40% of the input (when it is low), PWM 506 will flow in the forward direction and it will then reverse, path after 40%. At 80% of the period (assuming the forward and the reverse path delays are the same), latch comparator 504 will latch PWM 506 which was high at the time.

Any digital scheme based on delay lines, will require calibration or trim to support large frequency range of operation (as required by M-PHY standard). Delay variation across process, voltage and temperate is on the order of a factor of three (X3). Due to large variation in delay cells, analog schemes are attractive. The conventional analog scheme is based on charge-pump with charging and discharging currents. Output can be compared to a known reference (close to ground) using a comparator. This circuit performance is limited by the positive and negative differential input current mismatches and also on the accuracy of the voltage reference. As such, these types of conventional circuits consume lower power but this will occupy more area compared to a digital implementation.

What is needed is a low power PWM receiver that operates at a low power without taking up large amounts of real estate.

BRIEF SUMMARY

The present invention provides a low power PWM receiver that operates at a low power without taking up large amounts of real estate.

In accordance with aspects of the present invention a circuit is provided for use with a PWM signal having first puke and a second pulse, wherein the first pulse has a period and a first duty cycle, and the second pulse has the period and a second duty cycle. The period has clock information therein, the first duty cycle has first data information therein, and the second duty cycle has second data information therein. The circuit includes a first integrating component and a second integrating component. The first integrating component can generate a first voltage corresponding to the first duty cycle and a second voltage corresponding to the first duty cycle. The second integrating component can generate a third voltage corresponding to the second duty cycle and a fourth voltage corresponding to the second duty cycle.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and together with the description, serve to explain the principles of the invention. In the drawings:

FIG. 6 illustrates an example system in accordance with aspects of the present invention;

FIG. 7 illustrates an example PWM receiver in accordance with aspects of the present invention;

FIG. 8 illustrates an exploded view of the example differential cyclic integrator of the PWM receiver of FIG. 7;

FIG. 9 illustrates the differential cyclic integrator of FIG. 8 at a time $t_1$;

FIG. 13 illustrates the differential cyclic integrator of FIG. 8 at a time $t_4$;

FIG. 14 illustrates the differential cyclic integrator of FIG. 8 at a time $t_5$;

DETAILED DESCRIPTION

Figure 1:
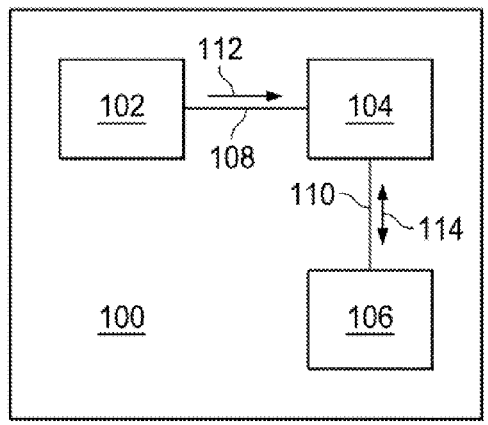
FIG. 1 illustrates an electronic device that uses PWM signals for internal communication.
Figure 2:
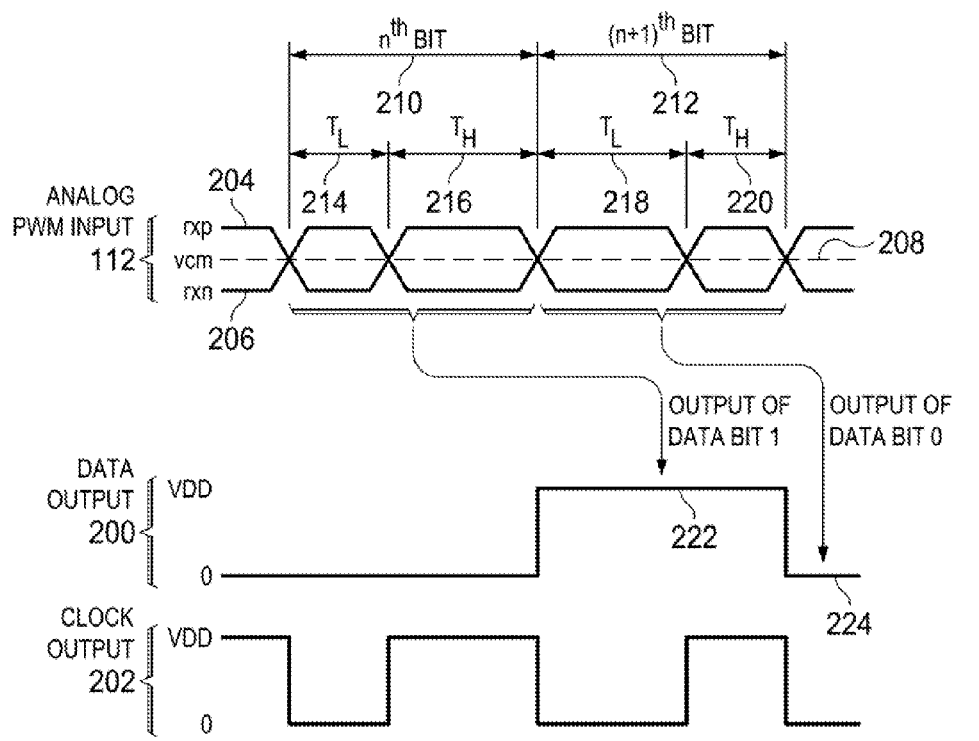
FIG. 2 illustrates a differential PWM signal and it's corresponding data and clock outputs.
Figure 3:
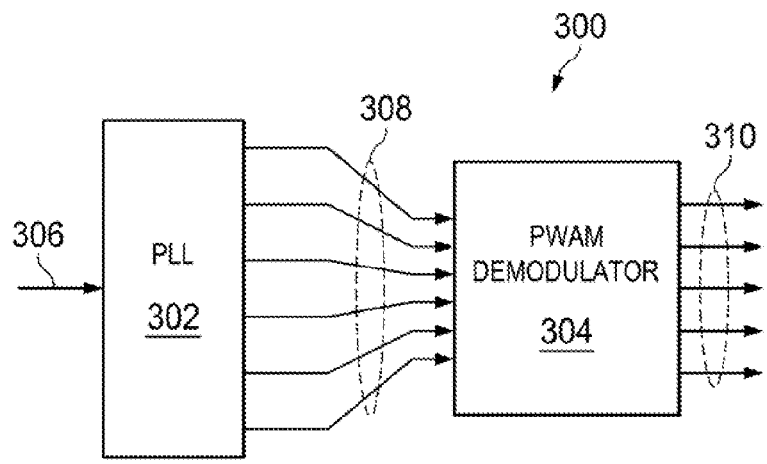
FIG. 3 illustrates a conventional PWM receiver.
Figure 4:
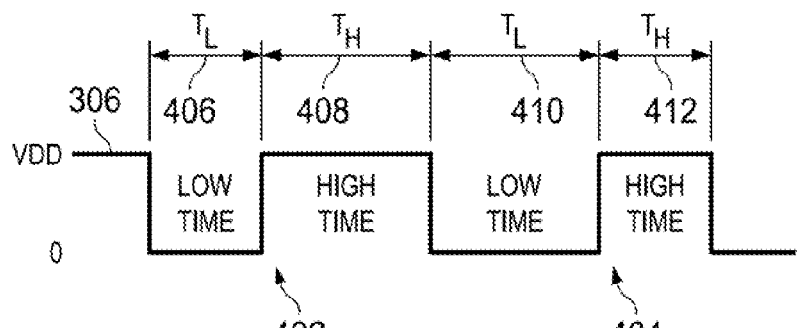
FIG. 4 illustrates an example PWM signal.
Figure 5:
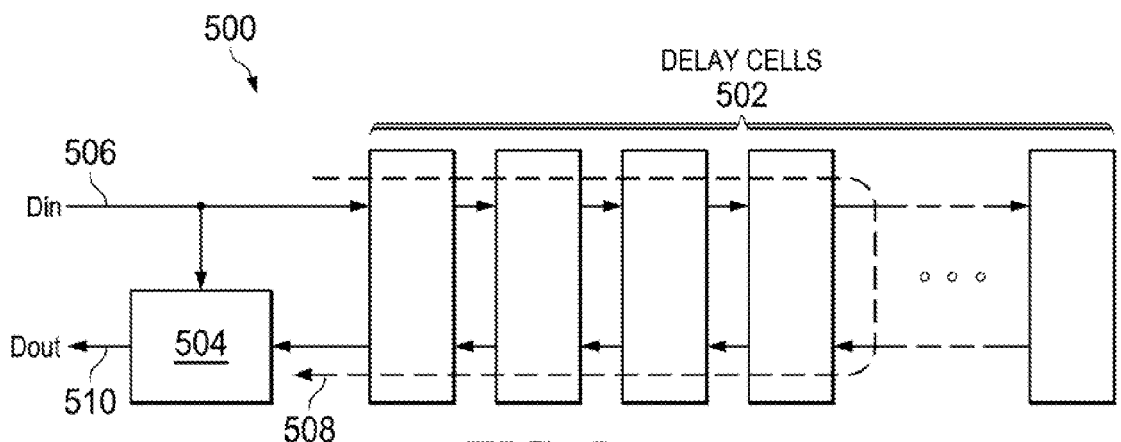
FIG. 5 illustrates another conventional PWM receiver.

One aspect of the present invention is drawn to a PWM receiver that includes a differential cyclic integrator (DCI). For a received PWM signal, the DCI associates a first voltage to the $T_H$ of a bit within a PWM signal and associates a second voltage to the $T_L$ of the bit. This is the integrating function of the DCI. Further, the DCI is arranged such that the first voltage and the second voltage will be different. This is the differential function of the DCI. Still further, the DCI will be able to cycle through states such that an $n^{th}$ bit and an $(n+1)^{th}$ bit will be alternately decoded. This is the cyclic function of the DCI.

Another aspect of the present invention is drawn to a latching system that enables values generated by the DCI to be associated with digital information bits.

These aspects of the present invention will now be described in greater detail with reference to FIGS. 6-16.

FIG. 6 illustrates an example system 600 in accordance with aspects of the present invention.

As shown in the figure, system 600 includes an amplifier 602, a buffer 604 and a PWM receiver 606. In this example, amplifier 602, buffer 604 and PWM receiver 606 are distinct elements. However, in some embodiments, at least two of amplifier 602, buffer 604 and PWM receiver 606 may be combined as a unitary element.

Amplifier 602 is arranged to receive a positive differential PWM signal on a positive input channel 608, to receive a negative differential PWM signal on a negative input channel 610, and to output an amplified PWM signal to an output channel 616. Amplifier 602 may be any known amplifier that is able to amplify a PWM signal. In this non-limiting example, the PWM signal is a differential PWM signal. However, in accordance with aspects of the present invention, the PWM signal may be a non-differential PWM signal.

Buffer 604 is arranged to receive the amplified PWM signal from output channel 616 and to output a buffered signal on an output channel 622. Buffer 604 may be any known buffer that is operable to output a clock signal based on the amplified PWM signal. In this manner, as known to those of skill in the art, the buffered signal will correspond to a clock signal having a period equal to the period of the amplified PWM signal.

PWM receiver 606 is arranged: to receive the amplified PWM signal from output channel 616; to receive an enable signal on an enable channel 624; to receive trim bits on a trim bit channel 626; to receive a bias signal on bias channel 628; and to output a data signal on data channel 630.

The enable signal enables PWM receiver 606. Trim bits are provided for instances where variable capacitors are used and the capacitances of each need to be so for a predetermined frequency of operation.

In accordance with aspects of the present invention, PWM receiver 606 outputs data bits as the data signal on data channel 630, where the data bits are associated with data within the amplified PWM signal as received on output channel 616. PWM receiver 606 associates a value with the duty cycle of each bit within the amplified PWM signal. In a non-limiting example embodiment, PWM receiver 606: first associates a first voltage with the $T_H$ of a bit within the amplified PWM signal and associates a second voltage with the $T_L$ of the same bit within the amplified PWM signal; then associates a bit value e.g., 1 or 0, to the bit within the amplified PWM signal as a function of the first voltage and the second voltage. In a specific non-liming example embodiment, PWM receiver 606 associates a bit value, e.g., 1 or 0, to the bit within the amplified PWM signal based on the difference between the first voltage and the second voltage.

PWM receiver 606 may be any receiver that is able to perform the above-discussed functions a non-limiting example of which will now be described with reference to FIGS. 7-8.

FIG. 7 illustrates an example of PWM receiver 606 in accordance with aspects of the present invention.

As shown in the figure, PWM receiver 606 includes a controlling component 702, a differential cyclic integrator (DCI) 704, a latch 706, a latch 708 and a multiplexer (MUX) 710. In this example, controlling component 702, DCI 704, latch 706, latch 708 and MUX 710 are distinct elements. However, in some embodiments, at least two of controlling component 702, DCI 704, latch 706, latch 708 and MUX 710 may be combined as a unitary element.

Controlling component 702 is arranged: to receive the amplified PWM signal from output channel 616; to receive to receive the enable signal on enable channel 624; to receive the trim bits on trim bit channel 626; and to output a plurality of control signals on a plurality of control channels 712. The plurality of control channels 712 include latch control channels 714, which transmit latch control signals, and MUX control channel 716, which transmits a MUX select signal.

Controlling component 702 is operable to provide an amplified signal to DCI 704 and to control the operation of DCI 704. Controlling component 702 additionally controls, latch 706, latch 708 and MUX 710.

DCI 704 is arrange: to receive some of the plurality of control signals from controlling component 702; to receive the bias signal on bias channel 628; and to output a voltage $V_1$ on a channel 718, to output a voltage $V_2$ on a channel 720, to output a voltage $V_3$ on a channel 722 and to output a voltage $V_4$ on a channel 724.

DCI 704 is operable to generate differential voltages based on the duty cycle if bits within the amplified signal supplied by controlling component 702. Two consecutive bits are resolved using different sets of differential voltages.

In an example embodiment, DCI 704 outputs $V_1$ based on $T_L$ of an $n^{th}$ bit, outputs $V_2$ based on $T_H$ of the $n^{th}$ bit, outputs $V_3$ based on $T_L$ of an $(n+1)^{th}$ bit and outputs $V_4$ based on $T_H$ of the $(n+1)^{th}$ bit.

Further, DCI 704 is able to output values $V_1$-$V_4$ cyclically. In particular, as will be described in greater detail later, in a first state, DCI 704 outputs $V_1$ based on $T_L$ of an $n^{th}$ bit and resets values for $V_3$ and $V_4$ of a $(n-1)^{th}$ bit, which would have been previously processed. In a second state, DCI 704 outputs $V_2$ based on $T_H$ of the $n^{th}$ bit. In a third state, DCI 704 outputs $V_3$ based on $T_L$ of the $(n+1)^{th}$ bit. In a fourth state, DCI 704 outputs $V_4$ based on $T_H$ of the in $(n+1)^{th}$ bit and resets values for $V_1$ and $V_2$ of the $n^{th}$ bit, which was previously processed. DCI 704 continues in this cycle.

Latch 706 is arranged: to receive $V_1$ from channel 718; to receive $V_2$ from channel 720; and to output a latch signal $L_1$ on a channel 726. Latch 708 is arranged: to receive $V_3$ from channel 722; to receive $V_4$ from channel 724; and to output a latch signal $L_2$ on a channel 728.

Latch 706 and latch 708 are used to demodulate the consecutive bits based on the differential voltages generated by DCI 704. For example, latch 706 may demodulate an $n^{th}$ bit, whereas latch 708 may demodulate an $(n+1)^{th}$ bit.

MUX 710 is arranged: to receive $L_1$ from channel 726; to receive $L_2$ from channel 728; to receive the MUX select signal from channel 716; and to output the data signal on data channel 630.

MUX 710 is used to multiplex between the outputs from latch 706 and latch 708.

The aspects of the present invention drawn to DCI 704 will be described in more detail with reference to FIGS. 8-14.

FIG. 8 illustrates an exploded view of an example of DCI 704 of PWM receiver 606 of FIG. 7.

As shown in FIG. 8, DCI 704 includes an integrating component 802, an integrating component 804, a clamp 806 and a current source 808. Integrating component 802, integrating component, 804 and clamp 806 are arranged in parallel between current source 808 and ground.

Current source 808 provides current, as supplied from a supply rail, to integrating component 802 and integrating component 804. Current source 808 is biased by the bias signal provided by bias channel 628.

Integrating component 802 includes a switch 810, a switch 812, a switch 814, a switch 816, a capacitor 818 and a capacitor 820. Switch 810 is arranged such that when closed, current from current source 808 flows toward ground to charge capacitor 818, and such that when open, no current flows from current source 808 to capacitor 818. Switch 812 is arranged such that when closed, current from current source 808 flows toward ground to charge capacitor 820, and such that when open, no current flows from current source 808 to capacitor 820. Switch 814 is arranged such that when open, any charge stored in capacitor 818 is output as $V_1$ on channel 718, and such that when closed, any charge stored in capacitor 818 is discharged to ground. Switch 816 is arranged such that when open, any charge stored in capacitor 820 is output as $V_2$ on channel 720, and such that when closed, any charge stored in capacitor 820 is discharged to ground.

Any of capacitors 818, 820, 830 and 832 may be any known type of capacitor. In an example embodiment, capacitors 818, 820, 830 and 832 have an equal capacitance. In some embodiments, the capacitance of each of capacitors 818, 820, 830 and 832 is fixed. In some embodiments, the capacitance of each of capacitors 818, 820, 830 and 832 is variable and may be adjusted via trim bits provided by controlling component 702.

Each of switches 810, 812, 814, 816, 822, 824, 826 and 828 are controlled via digital signals not shown) from controlling component 702 i.e., the portion of the plurality of control signals on the portion of the plurality of control channels 712 other than latch control channels 714 and MUX control channel 716. Any of switches 810, 812, 814, 816, 822, 824, 826 and 828, and clamp 806 may be any known type of switch, non-limiting examples of which include transistors.

Clamp 806 provides a predetermined bias to ensure that none of capacitors 818, 820, 830 and 832 will store too much charge. In particular, Integrating component 802 may be considered to include a first voltage integrating component of switch 810 and capacitor 818, and a second voltage integrating component of switch 812 and capacitor 820.

Integrating component 804 includes a switch 822, a switch 824, a switch 826, a switch 828, a capacitor 830 and a capacitor 832. Switch 822 is arranged such that when dosed, current from current source 808 flows toward ground to charge capacitor 830, and such that when open, no current flows from current source 808 to capacitor 830. Switch 824 is arranged such that when closed, current from current source 808 flows toward ground to charge capacitor 832, and such that when open, no current flows from current source 808 to capacitor 832. Switch 826 is arranged such that when open, any charge stored in capacitor 830 is output as $V_3$ on channel 722, and such that when closed, any charge stored in capacitor 830 is discharged to ground. Switch 828 is arranged such that when open, any charge stored in capacitor 832 is output as $V_4$ on channel 724, and such that when closed, any charge stored in capacitor 832 is discharged to ground.

Integrating component 804 may be considered to include a first voltage integrating component of switch 822 and capacitor 830, and a second voltage integrating component of switch 824 and capacitor 832.

Figure 11:
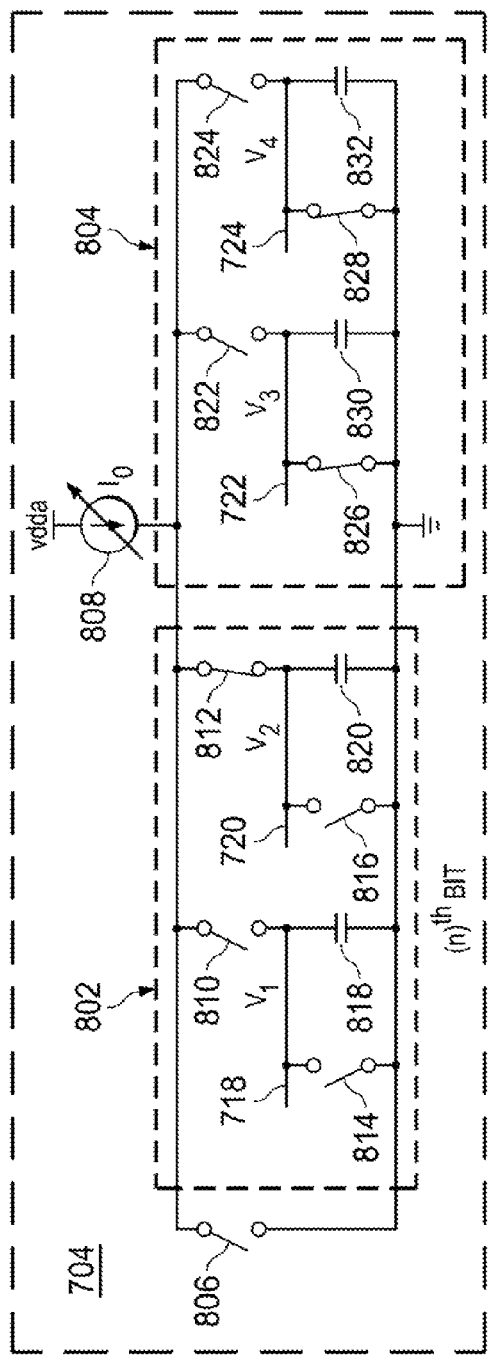
FIG. 11 illustrates the differential cyclic integrator of FIG. 8 at a time $t_2$.
Figure 12:
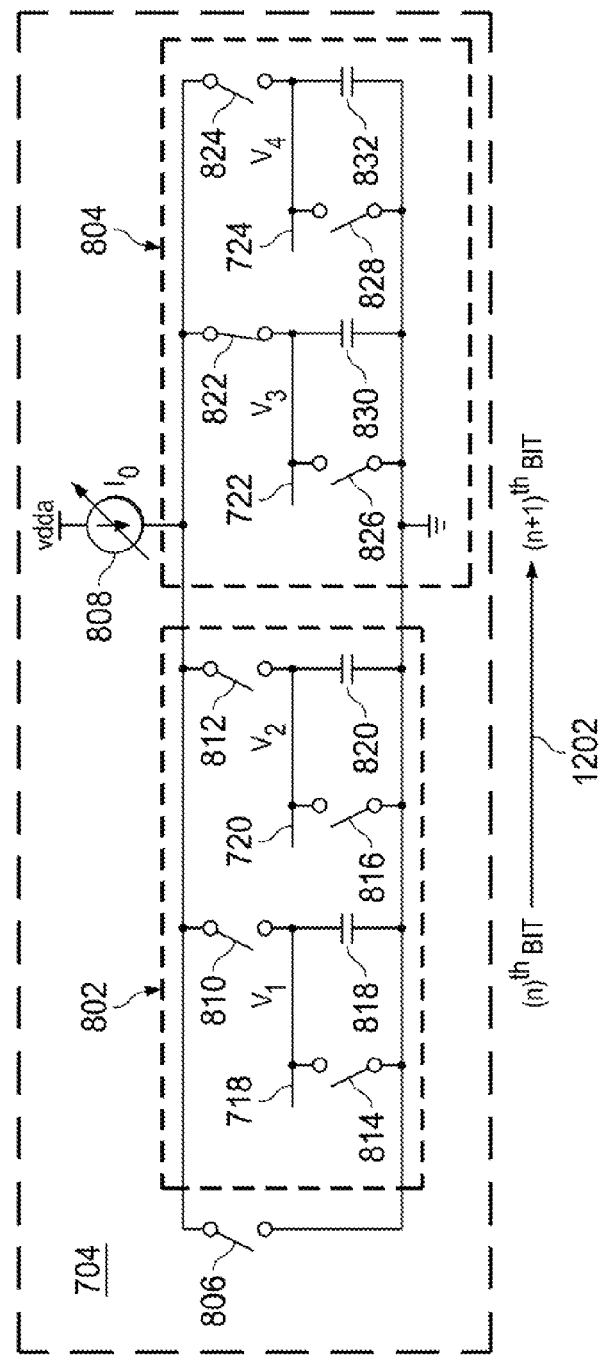
FIG. 12 illustrates the differential cyclic integrator of FIG. 8 at a time $t_3$.

The operation of DCI 704 to demodulate a PWM signal to determine data within a data signal will now be described with additional reference to FIGS. 9-14. FIGS. 9 and 11 describe the states of DCI 704 when determining an $n^{th}$ bit in an amplified PWM signal as provided on output channel 616. FIGS. 12-13 describe the states of DCI 704 when determining an $(n+1)^{th}$ bit in the amplified PWM signal as provided on output channel 616.

FIG. 9 illustrates DCI 704 of FIG. 8 at a time $t_1$.

As shown in FIG. 9, at time $t_1$, in integrating component 802, switch 810 is closed and each of switches 812, 814 and 816 are open. Further, in integrating component 804, switches 822 and 824 are open and switches 826 and 828 are closed.

The voltages within DCI 704 in FIG. 9 and FIGS. 11-14 will be described with additional reference to FIG. 10.

Figure 10:
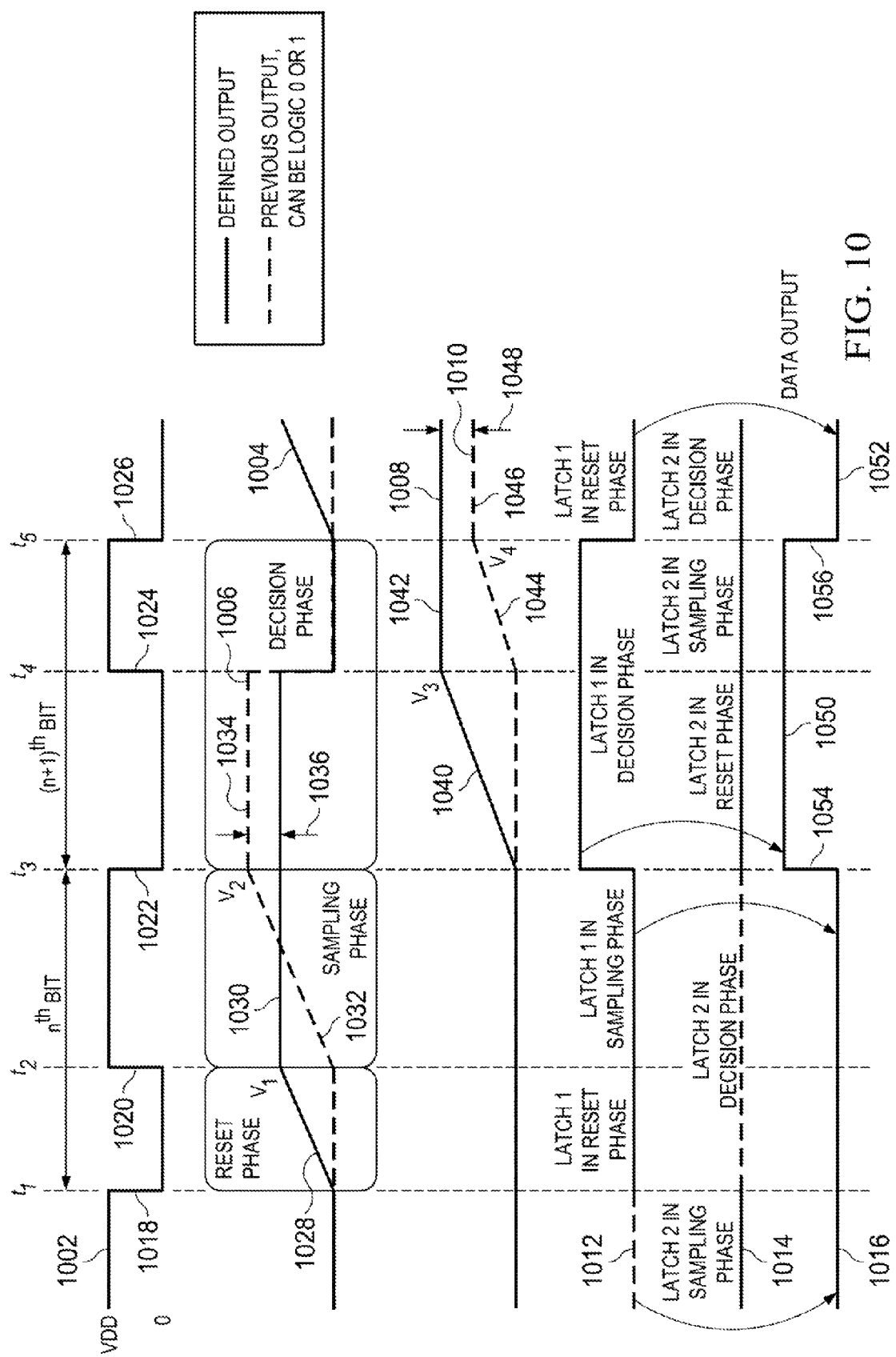
FIG. 10 illustrates example voltages associated with the differential cyclic integrator of FIG. 8 at times $t_1$, $t_2$, $t_3$, $t_4$ and $t_5$.

FIG. 10 illustrates example voltages associated with the differential cyclic integrator of FIG. 8 at times $t_1$, $t_2$, $t_3$, $t_4$ and $t_5$.

FIG. 10 includes a function 1002, a function 1004, a function 1006, a function 1008, a function 1010, a function 1012, a function 1014 and a function 1016.

Function 1002 corresponds to the amplified PWM signal as provided on output channel 616 as a function of time. Function 1002 includes a plurality of pulses defined by a falling edge 1018 at time $t_1$, a rising edge 1020 at time $t_2$, a falling edge 1022 at time $t_3$, a rising edge 1024 at time $t_4$ and a falling edge 1026 at time $t_5$. An $n^{th}$ bit corresponds to the pulse from times $t_1$-$t_3$, or just after falling edge 1018 to falling edge 1022. For the $n^{th}$ bit, the $T_1$ is from $t_1$-$t_2$ and the $T_H$ is from $T_1$-$T_3$. An $(n+1)^{th}$ bit corresponds to the pulse from times $t_3$-$t_5$, or just after falling edge 1022 to falling edge 1026. For the $(n+1)^4$ bit, the $T_L$ is from $t_3$-$t_4$ and the $T_H$ is from $T_4$-$T_5$.

Function 1004 corresponds to $V_1$, the voltage at capacitor 818 as a function of time. Function 1004 has a rising portion 1028 and a constant portion 1030. Rising portion 1028 starts at time $t_2$ and continues to time $t_2$. Constant portion 1030 starts at time $t_2$ and continues to time $t_4$.

Function 1006 corresponds to $V_2$, the voltage at capacitor 820 as a function of time. Function 1006 has a rising portion 1032 and a constant portion 1034. Rising portion 1032 starts at time $t_2$ and continues to time $t_3$. Constant portion 1034 starts at time $t_3$ and continues to time $t_4$.

Function 1008 corresponds to $V_3$, the voltage at capacitor 830 as a function of time. Function 1008 has a rising portion 1040 and a constant portion 1042. Rising portion 1040 starts at time $t_3$ and continues to time $t_4$. Constant portion 1042 starts at time $t_4$.

Function 1010 corresponds to $V_4$, the voltage at capacitor 832 as a function of time. Function 1010 has a rising portion 1044 and a constant portion 1046. Rising portion 1044 starts at time $t_4$ and continues to time $t_5$. Constant portion 1046 starts at time $t_5$.

Function 1012 corresponds to the output of latch 706, whereas function 1014 corresponds to the output of latch 708.

Function 1016 corresponds to data signal on data channel 630, as shown in FIG. 6. Function 1016 has a data bit 1050 and a data bit 1052. Data bit 1050 corresponds to a rising edge 1054 at time $t_3$ and to falling edge 1056 at time $t_5$. Data bit 1052 corresponds to the time just after falling edge 1056.

Returning to FIG. 9, controlling component 702 controls switch 810 to close and controls switches 812, 822 and 824 to open. For purposes of discussion, let controlling component establish this state of DCI 704 at falling edge 1018 of function 1002. Current provided by current source 808 will only flow to integrating component 802. More specifically, current provided by current source 808 will only flow through switch 810, wherein the current charges capacitor 818. This can be seen in FIG. 10, wherein between times $t_1$ and $t_2$, voltage $V_1$ starts to rise as shown in rising portion 1028. As further seen in FIG. 10, between times $t_1$ and $t_2$, voltages $V_2$, $V_3$ and $V_4$ are zero.

At the next edge of function 1002, controlling component 702 will change the state of DCI 704. In this example, at time $t_2$, function 1002 has rising edge 1020.

FIG. 11 illustrates DCI 704 of FIG. 8 at a time $t_2$.

As shown in FIG. 11, at time $t_2$, in integrating component 802, switch 812 is closed and each of switches 810, 814 and 816 are open. Further, in integrating component 804, switches 822 and 824 are open, whereas switched 826 and 828 are closed.

In this state, current provided by current source 808 will still only flow to integrating component 802. More specifically during this period current provided by current source 808 will only flow through switch 812, wherein the current charges capacitor 820. This can be seen in FIG. 10, wherein between times $t_2$ and $t_3$, voltage $V_2$ starts to rise as shown in rising portion 1032. Further, between times $t_1$ and $t_2$, voltage $V_1$ remains constant. As further seen in FIG. 10, between times $t_1$ and $t_2$, voltages $V_3$ and $V_4$ are zero.

At the next edge of function 1002, controlling component 702 will again change the state of DCI 704. In this example, at time function 1002 has falling edge 1022.

FIG. 12 illustrates DCI 704 of FIG. 8 at a time $t_3$.

As shown in FIG. 12, at time $t_3$, in integrating component 804, switch 822 is closed and each of switches 824, 826 and 828 are open. Further, in integrating component 802, switches 810, 814 and 816 are open.

In this state, current provided by current source 808 will still only flow to integrating component 804. More specifically, during this period current provided by current source 808 will only flow through switch 822, wherein the current charges capacitor 830. This can be seen in FIG. 10, wherein between times $t_3$ and $t_4$, voltage $V_3$ starts to rise as shown in rising portion 1040. Further, between times $t_3$ and $t_4$, voltages $V_1$ and $V_2$ remain constant. As further seen in FIG. 10, between times $t_3$ and $t_4$, voltage $V_4$ is zero.

Furthermore, between times $t_3$ and $t_4$, latch 706 as shown in FIG. 7 is in its decision stage, wherein latch 706 will determine whether the data associated with the $n^{th}$ bit is a 1 or a 0. DCI 704 provides $V_1$ to latch 706 via channel 718 and provides $V_2$ to latch 706 via channel 720.

Again, a PWM bit is a 1 if the $T_H > T_L$. Returning to FIG. 10, in accordance with aspects of the present invention, $T_H$ is proportional to a stored charge and $T_L$ is proportional to another stored charge. In this example embodiment, $T_H$ is proportional to $V_2$, whereas $T_L$ is proportional to $V_1$. Therefore, in this example, because the time period from $t_1$ to $t_2$ is less than the time period between $t_2$ and $t_3$, is less than $V_2$. This difference between $V_2$ and $V_1$ is shown in FIG. 10 by double arrow 1036. Irrespective of the magnitude of the difference, so long as it can be shown that $V_2$ is greater than $V_1$, and thus $H_T > H_L$, then latch 706 provides an output data value of 1 as shown in data bit 1050 of function 1016.

More specifically, controlling component 702 instructs latch 706 to output the data value of 1 as latch signal $L_1$ on channel 726 to MUX 710. Controlling component 702 then instructs MUX 710 to output latch signal $L_1$, in this example a data value of 1, as the data signal for the $n^{th}$ bit on data channel 630.

Returning to FIG. 10, at the next edge of function 1002, controlling component 702 will change the state of DCI 704. In this example, at time $t_4$, function 1002 has rising edge 1024.

FIG. 13 illustrates DCI 704 Of FIG. 8 at a time $t_4$.

As shown in FIG. 13, at time $t_4$, in integrating component 804, switch 824 is closed and each of switches 822, 826 and 828 are open. Further, in integrating component 802, switches 810 and 812 are open, whereas switches 814 and 816 are closed.

In this state, current: provided by current source 808 will still only flow to integrating component 804. More specifically, during this period, current provided by current source 808 will only flow through switch 824, wherein the current charges capacitor 832. This can be seen in FIG. 10, wherein between times $t_4$ and $t_5$, voltage $V_4$ starts to rise as shown in rising portion 1044. Further, between times $t_4$ and $t_5$, voltage $V_3$ remains constant.

As further seen in FIG. 10, between times $t_4$ and $t_5$, voltages $V_1$ and $V_2$ are zero. This is attributed to the resetting of integrating component 802. In particular, returning to FIG. 13, when switch 814 is closed, the previously stored charge in capacitor 818 is discharged to ground, thus removing the voltage at channel 718. Similarly, when switch 816 is closed, the previously stored charge in capacitor 820 is discharged to ground, thus removing the voltage at channel 720.

At the next edge of function 1002, controlling component 702 will again change the state of DCI 704. In this example, at time $t_5$, function 1002 has falling edge 1026.

FIG. 14 illustrates DCI 704 of FIG. 8 at a time $t_5$. More particularly, FIG. 14 shows that DCI 704 returns to the same state as that shown in FIG. 9. In this manner, integrating component 802 can start integrating the $(n+2)^{th}$ bit.

As shown in FIG. 14, at time $t_5$, in integrating component 802, switch 810 is closed and each of switches 812, 814 and 816 are open. Further, in integrating component 804, switches 822 and 824 are open, whereas switched 826 and 828 are closed.

In this state, current provided by current source 808 will still only flow to integrating component 802. More specifically, during this period current provided by current source 808 will only flow through switch 810, wherein the current charges capacitor 818. This can be seen in FIG. 10, wherein after time $t_5$, voltage $V_1$ starts to rise. Further, after time $t_5$, voltages $V_3$ and $V_4$ remain constant. As further seen in FIG. 10, after times $t_5$, voltage $V_2$ is zero.

Furthermore, after time $t_5$, latch 708 as shown in FIG. 7 is in its decision stage, wherein latch 708 will determine whether the data associated with the $(n+1)^{th}$ bit is a 1 or a 0. DCI 704 provides $V_3$ to latch 708 via channel 722 and provides $V_4$ to latch 708 is channel 724.

Again, a PWM bit is a 0 if the $T_H < T_L$. Returning to FIG. 10, in accordance with aspects of the present invention, $T_H$ is proportional to a stored charge and $T_L$ is proportional to another stored charge. In this example embodiment, $T_H$ is proportional to $V_4$, whereas $T_L$ is proportional to $V_3$. Therefore, in this example, because the time period from $t_3$ to $t_4$ is greater than the time period between $t_4$ and $t_5$, $V_3$ is greater than $V_4$. This difference between $V_4$ and $V^3$ is shown in FIG. 10 by double arrow 1048. Irrespective of the magnitude of the difference, so loan as it can be shown that $V_3$ is greater than $V_4$, and thus $H_T < H_L$, then latch 708 provides an output data value of 0 as shown in data bit 1052 of function 1016.

More specifically, controlling component 702 instructs latch 708 to output the data value of 0 as latch signal $L_2$ on channel 728 to MUX 710. Controlling component 702 then instructs MUX 710 to output latch signal $L_2$, in this example a data value of 0, as the data signal for the $(n+1)^{th}$ bit on data channel 630.

In this manner, PWM receiver 606 efficiently demodulates a low-power PWM signal by cycling through states of the DCI 704. In a first state, capacitor 818 of integrating component 802 integrates a voltage associated with $T_L$ of an $n^{th}$ bit, while the voltages provided by capacitors 830 and 832 in integrating component 804 are provided to latch 708 to find the value of the $(n-1)^{th}$ bit. In a second state, capacitor 820 of integrating component 802 integrates a voltage associated with $T_H$ of the $n^{th}$ bit, while integrating component 804 is reset—i.e., capacitors 830 and 832 are discharged. In 1 third state, capacitor 830 of integrating component 804 integrates a voltage associated with $T_L$ of an $(n+1)^{th}$ bit, while the voltages provided by capacitors 818 and 820 in integrating component 802 are provided to latch 706 to find the value of the $n^{th}$ bit. Finally, in a fourth state, capacitor 832 of integrating component 804 integrates a voltage associated with $T_H$ of the $(n+1)^{th}$ bit, while integrating component 802 is reset—i.e., capacitors 818 and 820 are discharged.

By cycling through the four states discussed above, DCI 704 is able to alternately process bits in an efficient manner. Further, because PWM receiver 606 determines the value of a bit based on a difference between voltages integrated over time, a change in the amplitude in the signal would not disrupt the effectiveness of the invention. This will be described in greater detail with reference to FIGS. 15-16.

Figure 15:
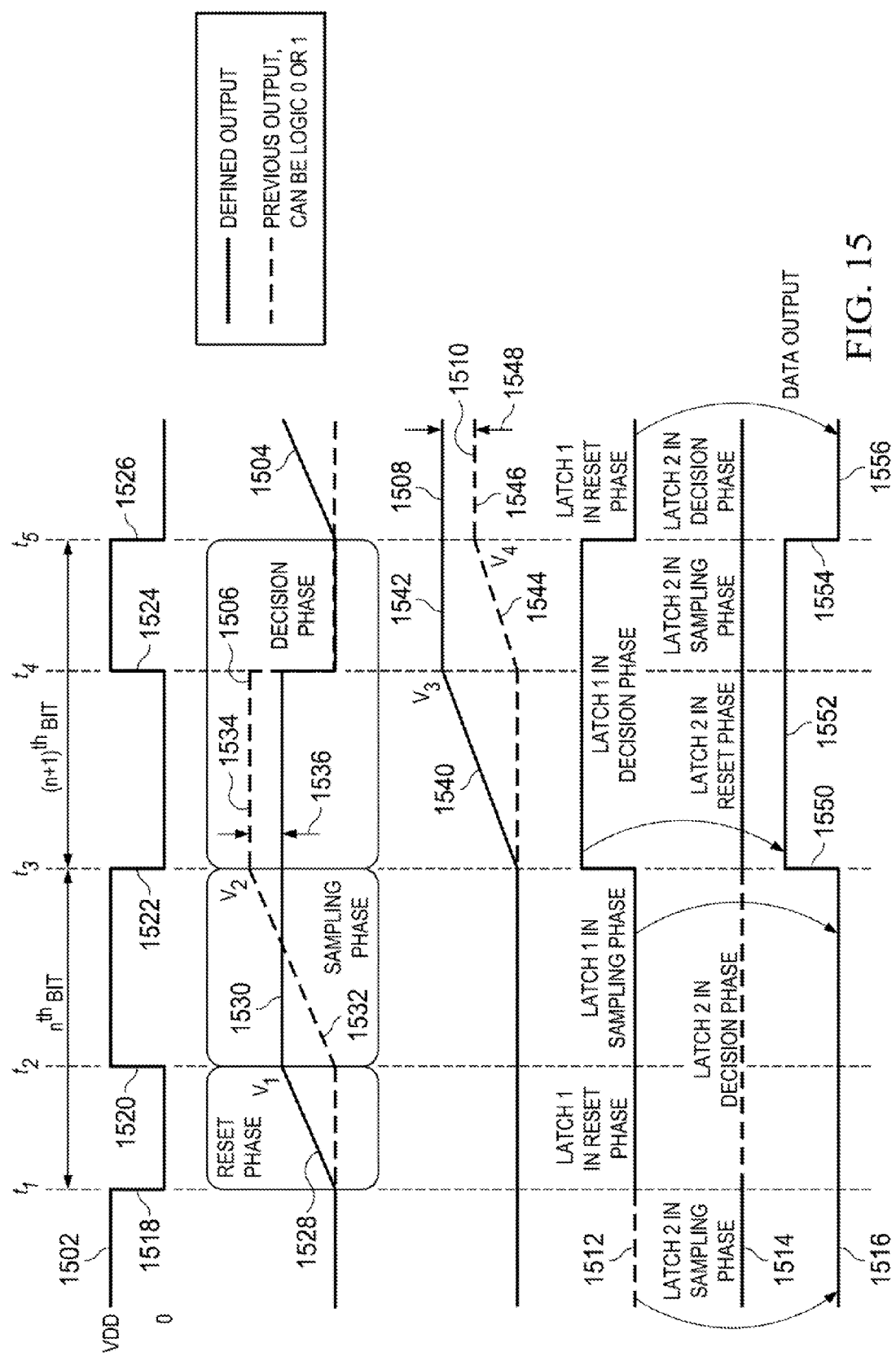
FIG. 15 illustrates more example voltages associated with the differential cyclic integrator of FIG. 8 at times $t_1$, $t_2$, $t_3$, $t_4$ and $t_5$.

FIG. 15 illustrates more example voltages associated with the differential cyclic integrator of FIG. 8 at times $t_1$, $t_2$, $t_3$, $t_4$ and $t_5$. In this example, the PWM signal has a larger amplitude than the PWM signal discussed above with reference to FIG. 10.

FIG. 15 includes a function 1502, a function 1504, a function 1506, a function 1508, a function 1510, a function 1512, a function 1514 and a function 1516, which correspond to functions 1002, 1004, 1006, 1008, 1010, 1012, 1014 and 1016 of FIG. 10, respectively.

A main difference between the function in FIG. 15 and the functions in FIG. 10 is that the amplitude of function 1502 is greater than the amplitude of function 1002. Because the amplitude of function 1502 is greater, more charge will be stored in the capacitors during the charging periods. Nevertheless, in accordance with an aspect of this embodiment, it is the difference between the voltage stored in capacitor 818 and the voltage stored in capacitor 820 and the difference between the voltage stored in capacitor 830 and the voltage stored in capacitor 832 that are important.

Again, a PWM bit is a 1 if the $T_H > T_L$. In this example embodiment, $T_H$ is proportional to $V_2$, whereas $T_L$ is proportional to $V_1$. Therefore, in this example, because the time period from $t_1$ to $t_2$ is less than the time period between $t_2$ and $t_3$, $V^1$ is less than $V_2$. This difference between $V_2$ and $V_1$ is shown in FIG. 15 by double arrow 1536. Irrespective of the magnitude of the difference, so long as it can be shown that $V_2$ is greater than $V_1$, and thus $H_T > H_L$, then latch 706 provides an output data value of 1 as shown function 1516.

Similarly, a PWM bit is a 0 if the $T_H < T_L$. In this example embodiment, $T_H$ is proportional to $V_4$, whereas $T_L$ is proportional to $V_3$. Therefore, in this example, because the time period from $t_3$ to $t_4$ is greater than the time period between $t_4$ and $t_5$, $V_3$ is greater than $V_4$. This difference between $V_4$ and $V_3$ is shown in FIG. 15 by double arrow 1048. Irrespective of the magnitude of the difference, so long as it can be shown that $V_3$ is greater than $V_4$, and thus $H_T < H_L$, then latch 708 provides an output data value of 0 as shown in function 1516.

Figure 16:
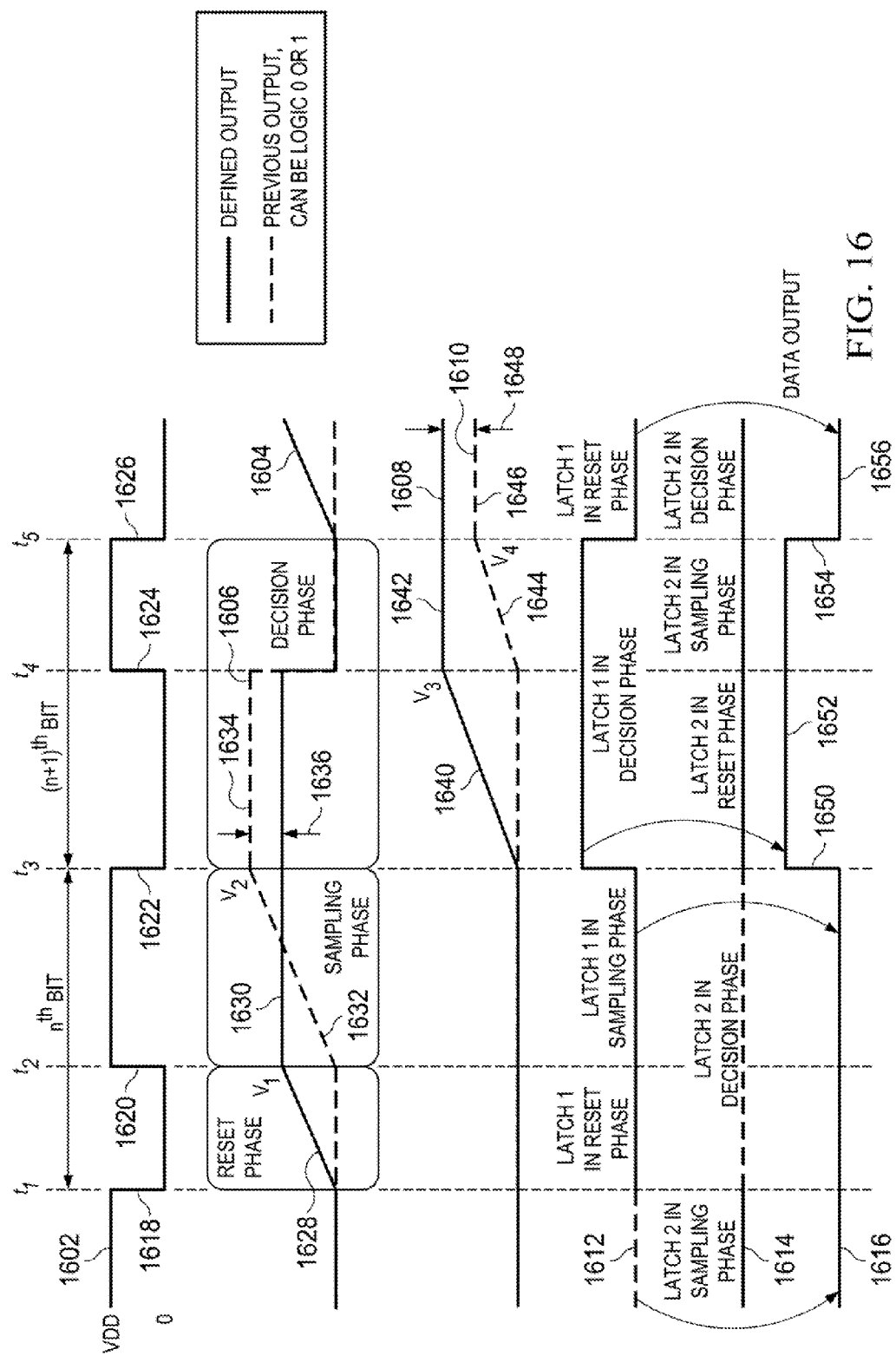
FIG. 16 illustrates still more example voltages associated with the differential cyclic integrator of FIG. 8 at times $t_1$, $t_2$, $t_3$, $t_4$ and $t_5$.

FIG. 16 illustrates still more example voltages associated with the differential cyclic integrator of FIG. 8 at times $t_1$, $t_2$, $t_3$, $t_4$ and $t_5$.

FIG. 16 illustrates more example voltages associated with the differential cyclic integrator of FIG. 8 at times $t_1$, $t_2$, $t_3$, $t_4$ and $t_5$. In this example, the PWM signal has a smaller amplitude than the PWM signal discussed above with reference to FIG. 10.

FIG. 16 includes a function 1602, a function 1604, a function 1606, a function 1608, a function 1610, a function 11612, a function 1614 and a function 1616, which correspond to functions 1002, 1004, 1006, 1008, 1010, 1012, 1014 and 1016 of FIG. 10, respectively.

A main difference between the function in FIG. 16 and the functions in FIG. 10 is that the amplitude of function 1602 is greater than the amplitude of function 1002. Because the amplitude of function 1602 is greater, more charge will be stored in the capacitors during the charging periods. Nevertheless, in accordance with an aspect of this embodiment, it is the difference between the voltage stored in capacitor 818 and the voltage stored in capacitor 820 and the difference between the voltage stored in capacitor 830 and the voltage stored ha capacitor 832 that are important.

Again, a PWM bit is a 1 if the $T_H > T_L$. In this example embodiment, $T_H$ is proportional to $V_2$, whereas $T_L$ is proportional to $V_1$. Therefore, in this example, because the time period from $t_1$ to $t_2$ is less than the time period between $t_2$ and $t_3$, $V_1$ is less than $V_2$. This difference between $V_2$ and $V_1$ is shown in FIG. 16 by double arrow 1636. Irrespective of the magnitude of the difference, so long as it can be shown that $V_2$ is greater than $V_1$, and thus $H_T > H_L$, then latch 706 provides an output data value of 1 as shown function 1616.

Similarly, a PWM bit is a 0 if the $T_H > T_L$. In this example embodiment, $T_H$ is proportional to $V_4$, whereas $T_L$ is proportional to $V^3$. Therefore, in this example, because the time period from $t_3$ to $t_4$ is greater than the time period between $t_4$ and $t_5$, $V_3$ is greater than $V_4$. This difference between $V_4$ and $V_2$ is shown in FIG. 16 by double arrow 1048. Irrespective of the magnitude of the difference, so long as it can be shown that $V_3$ is greater than $V_4$, and thus $H_T < H_L$, then latch 708 provides an output data value of 0 as shown in function 1616.

The present invention is drawn to low-power PWM signal receivers that demodulate a PWM signal to obtain data therein. The present invention is particularly useful with devices following the M-PHY standard.

Aspects include: a differential cyclic integrator: a differential operation for each demodulated bit; and a dual latch design that provides sufficient time for each latch to reset. Advantages include a power reduction on the order of 2× as compared to conventional systems.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A circuit for use with a pulse width modulated signal having first pulse and a second pulse, the first pulse having a period and first duty cycle, the second pulse having the period and a second duty cycle, the period having clock information therein, the first duty cycle having first data information therein, the second duty cycle having second data information therein, said circuit comprising:

a first integrating component operable to generate a first voltage corresponding to the first duty cycle and a second voltage corresponding to the first duty cycle;

a second integrating component operable to generate a third voltage corresponding to the second duty cycle and a fourth voltage corresponding to the second duty cycle;

an output component operable to output a first data bit corresponding to the first voltage and the second voltage and to output a second data bit corresponding to the third voltage and the fourth voltage; and a controlling component operable to control said first integrating component to eliminate the first voltage and the second voltage when said second integrating component generates the third and fourth voltage.

2. The circuit of claim 1,
wherein said output component comprises a first latch and a second latch,
wherein said first latch is operable to output a first latch signal based on a difference between the first voltage and the second voltage, and
wherein said second latch is operable to output a second latch signal based on a difference between the third voltage and the fourth voltage.

3. The circuit of claim 2, wherein said output component further comprises a multiplexer operable to output the first latch signal at a first time and to output the second latch signal at a second time.

4. The circuit of claim 3, wherein controlling component is additionally operable to control said multiplexer.

5. The circuit of claim 4,
wherein said first integrating component comprises a first voltage integrating component and a second voltage integrating component,
wherein said first voltage integrating component is operable to generate the first voltage corresponding to the first duty cycle; and
wherein said second voltage integrating component is operable to generate the second voltage corresponding to the first duty cycle.

6. The circuit of claim 5,
wherein said first voltage integrating component comprises a first capacitor and a first switch,
wherein said first switch is operable to be in an open state and a closed state,
wherein in the closed state, said first switch is operable to conduct the first pulse to said first capacitor to charge said first capacitor,
wherein in the open state, said first switch is operable to prevent the conduction to said first capacitor, and
wherein said controlling component is additionally operable to change said first switch from the open state to the closed state.

7. The circuit of claim 6,
wherein said first voltage integrating component additionally comprises a second switch,
wherein said second switch is operable to be in an open state and a closed state,
wherein said controlling component is additionally operable to put said second switch in the open state when the first switch is in the closed state,
wherein said controlling component is additionally operable to put said second switch in the closed state, after said capacitor is charged, so as to discharge said capacitor to ground.

8. The circuit of claim 7, further comprising a buffer operable to output a clock signal based on the pulse width modulated signal.

9. The circuit of claim 1, further comprising a buffer operable to output a clock signal based on the pulse width modulated signal.

10. A circuit for use with a pulse width modulated signal having first pulse and a second pulse, the first pulse having a period and a first duty cycle, the second pulse having the period and a second duty cycle, the period having clock information therein, the first duty cycle having first data information therein, the second duty cycle having second data information therein, said circuit comprising:
a first integrating component operable to generate a first voltage corresponding to the first duty cycle and a second voltage cones to the first duty cycle;
a second integrating component operable to generate a third voltage corresponding to the second duty cycle and a fourth voltage corresponding to the second duty cycle;
outputting, via an output component, a first data bit corresponding to the first voltage and the second voltage;
outputting, via the output component, a second data bit corresponding to the third voltage and the fourth voltage; and
controlling, via a controlling component, the first integrating component to eliminate the first voltage and the second voltage when the second integrating component generates the third and fourth voltage.

11. The method of claim 10, wherein said outputting, via an output component, a first data bit comprises outputting, via a first latch, a first latch signal based on a difference between the first voltage and the second voltage and outputting, via a second latch, a second latch signal based on a difference between the third voltage and the fourth voltage.

12. The method of claim 11, further comprises:
outputting, via a multiplexer, the first latch signal at a first time; and
outputting, via the multiplexer, the second latch signal at a second time.

13. The method of claim 12, further comprising controlling, via the controlling component, the multiplexer.

14. The method of claim 13,
wherein said generating, via a first integrating component, a first voltage corresponding to the first duty cycle comprises generating the first voltage via a first voltage integrating component, and
wherein said generating, via the first integrating component, a second voltage corresponding to the first duty cycle comprises generating the second voltage via a second voltage integrating component.

15. The method of claim 14,
wherein said generating the first voltage via a first voltage integrating component comprises generating the first voltage via a first capacitor and a first switch,
wherein the first switch is operable to be in an open state and a closed state,
wherein in the closed state, the first switch is operable to conduct the first pulse to the first capacitor to charge the first capacitor,
wherein in the open state, the first switch is operable to prevent the conduction to the first capacitor, and
wherein the controlling component is additionally operable to change the first switch from the open state to the closed state.

16. The method of claim 15,
wherein said generating the first voltage via a first capacitor and a first switch comprises generating the first voltage additionally via a second switch,
wherein the second switch is operable to be in an open state and a closed state,
wherein the controlling component is additionally operable to put the second switch in the open state when the first switch is in the closed state, and
wherein the controlling component is additionally operable to put the second switch in the closed state, after the capacitor is charged, so as to discharge the capacitor to ground.

17. The method of claim 16, further comprising outputting, via a delay component, a clock signal based on the pulse width modulated signal.

18. The method of claim 10, further comprising outputting, via a delay component, a clock signal based on the pulse width modulated signal.

* * * * *